United States Patent

Yamaura et al.

[19]

[11] Patent Number: 6,081,150
[45] Date of Patent: Jun. 27, 2000

[54] VOLTAGE CONTROL TYPE CONTROL APPARATUS CAPABLE OF ACHIEVING CORRECT CONTROL CHARACTERISTIC WITHOUT INCREASING INTERFACE LINE NUMBER

[75] Inventors: Tomoya Yamaura, Tokyo; Nobuhiko Watanabe, Kanagawa, both of Japan

[73] Assignee: Sony Corporation, Tokyo, Japan

[21] Appl. No.: 09/055,766

[22] Filed: Apr. 7, 1998

[30] Foreign Application Priority Data

Apr. 10, 1997 [JP] Japan .................................. 9-092545

[51] Int. Cl.⁷ ...................................................... H01J 19/82
[52] U.S. Cl. .......................... 327/306; 327/531; 330/127; 330/297
[58] Field of Search ..................................... 327/531, 532, 327/336, 306, 551; 330/297, 127

[56] References Cited

U.S. PATENT DOCUMENTS 5,748,023  5/1998  Hassner et al. .......................... 327/336
5,990,751  11/1999  Takita ...................................... 330/297

Primary Examiner—Jung Ho Kim
Attorney, Agent, or Firm—Jay H. Maioli

[57] ABSTRACT

In a control voltage producing apparatus, either a pulse-duration modulation signal or a pulse-width modulation signal, which are generated in response to a digital control signal, is from a first buffer circuit to an averaging circuit so as to be averaged. A power supply voltage is supplied from a first voltage source to this first buffer circuit. Then, the averaged signal is supplied to a control voltage producing circuit for producing a target control voltage. When a control voltage is produced, the same output voltage as that of the first buffer circuit is generated by a second buffer circuit, and then is supplied to the control voltage generating circuit and an operation control circuit. In response to the output voltage derived from the second buffer circuit, the operation control circuit applies the power supply voltage to the control voltage producing circuit so as to cause this control voltage producing circuit to be operable. Also, the control voltage producing circuit uses the output voltage derived from the second buffer circuit as the reference voltage so as to regulate the control voltage. As a consequence, in response to one of the output voltages derived from the second buffer circuit, turning ON/OFF of the control voltage producing circuit can be controlled, and further the reference voltage used to regulate the control voltage can be applied.

8 Claims, 8 Drawing Sheets

VOLTAGE CONTROL TYPE CONTROL APPARATUS CAPABLE OF ACHIEVING CORRECT CONTROL CHARACTERISTIC WITHOUT INCREASING INTERFACE LINE NUMBER

BACKGROUND OF THE INVENTION

The present invention is related to a voltage control type control apparatus suitably used in various electronic circuit arrangements requiring correct, or precise controls.

Conventionally, voltage control type control apparatuses arranged by digital circuits and analog circuits are widely known in the field.

One conventional voltage control type control apparatus is arranged as follows: A digital circuit thereof outputs a digital value, and this digital value is D/A-converted so as to produce a control voltage, and then a circuit characteristic of an analog circuit, for instance, a gain of this analog circuit is controlled by using this produced control voltage.

Especially, in order that a total number of interfaces provided on the output side of the digital circuit is reduced and a circuit scale is decreased as to this control signal, either a pulse-duration modulation (PDM) signal or a pulse-width modulation (PWM) signal is used as a digital output in such a voltage control type control apparatus. Also, in general, a simple RC low-pass filter is employed as a D/A converter.

It should be understood that basic operations of the digital outputs are commonly identical to each other either in the case of the pulse-duration modulation signal (will be abbreviated as a "PDM" signal hereinafter) or the pulse-width modulation signal (will be abbreviated a "PWM" signal hereinafter). Since there is no essential difference between them, the following description will be made of the operation by the PDM (pulse-duration modulation) signal.

Roughly speaking, the conventional voltage control type control apparatus with employment of the PDM signal is mainly classified into two different types of control apparatuses, for instance, a first prior art and a second prior art.

FIRST PRIOR ART

FIG. 1 is a functional block diagram for showing the conventional voltage control type control apparatus with employment of the PDM signal as the first prior art. In this drawing, reference numeral 10 shows a digital circuit; reference numeral 11 indicates a control unit; reference numeral 12 represents a PDM signal generating circuit; and reference numeral 13 denotes an output buffer circuit for the PDM signal. Also, reference numeral 20 represents an analog circuit; reference numeral 21 denotes a control voltage producing circuit; reference numeral 22 is a gain control circuit; and reference numeral 30 shows an LPF (low-pass filter). Furthermore, symbol "R" shows a resistor; symbol "C" indicates a capacitor; symbol "T1" represents a power supply terminal of the digital circuit 10; symbol "T2" indicates a PDM signal output terminal of the analog circuit 20; symbol "T3" represents a power supply terminal of the digital circuit 10; and symbol "T4" denotes a PDM signal input terminal of the analog circuit 20. Also, symbol "T5" shows an input terminal for a main signal supplied to the gain control circuit 22 of the analog circuit 20; symbol "T6" denotes an output terminal for a main signal supplied from the gain control circuit 22 of the analog circuit 20; symbol "Vdd" represents a power supply voltage of the digital circuit 10; and symbol "Vcc" shows a power supply voltage of the analog circuit 20.

It should be noted that in the voltage control type control apparatus shown in FIG. 1, the digital circuit 10 controls the circuit characteristic of the analog circuit 20, in particular, the gain of this analog circuit 20 is voltage-controlled.

Next, a description will now be made of the gain control operation by the voltage control type control apparatus shown in FIG. 1.

The control unit 11 contained in the digital circuit 10 calculates such a gain required for the gain control circuit 22 contained in the analog circuit 20, and converts this calculated gain into a control voltage value required by the gain control circuit 22, and furthermore converts the gain control voltage value into a digital gain control voltage value. This, this digital gain control voltage value is entered into the PDM signal generating circuit 12.

The PDM signal generating circuit 12 generates a PDM signal in correspondence with this digital gain control voltage value, and then supplies the generated PDM signal via the output buffer circuit 13 for the PDM signal and the output terminal T2 for the PDM signal to the digital circuit 10.

Then, the digital PDM signal outputted from the PDM signal output terminal T2 is entered into the LPF (low-pass filter) 30 having a proper time constant so as to be filtered out (smoothed), so that this digital PDM signal is converted into an analog PDM signal which will then be entered as a control voltage into the PDM signal input terminal T4 of the analog circuit 20.

In response to the entered control voltage, the control voltage producing circuit 21 of the analog circuit 20 produces a control signal, and then supplies the produced control signal to the gain control circuit 22.

In the gain control circuit 22, the gain is varied based on the received control signal, the signal entered from the input terminal T5, namely the main signal to the gain control circuit 22 is amplified, or attenuated, and thereafter the amplified, or attenuated main signal is supplied to the output terminal T6 of the main signal derived from the gain control circuit 22.

The conventional voltage control type control apparatus with using the PDM signal is operated in the above-described manner with employment of the above-explained circuit arrangement shown in FIG. 1.

On the other hand, this conventional voltage control type control apparatus owns the below-mentioned problems:

The PDM signal output buffer circuit 13 is basically constructed of the digital circuit, and the amplitude level of the output signal is directly proportional to the power supply voltage Vdd of the digital circuit 10.

At this time, if the voltage control characteristic of the analog circuit 20 is constituted by such a value regulated by the power supply voltage Vcc, then the control error caused by the variations in the power supply voltages of the circuits does not occur by making the power supply voltage Vdd equal to the power supply voltage Vcc.

However, in general, in order to avoid mixtures of the digital noise, or since the usable power supply voltages are different from each other, the voltage Vdd applied to the power supply terminal T1 of the digital circuit 10 and the voltage Vcc applied to the power supply terminal T3 of the analog circuit 20 are connected to the different regulators from each other. As a result, such a control error happens to occur.

Referring now to FIG. 2 and FIG. 3, a detailed description will be made of the occurrence reason why this control error happens to occur.

FIG. 2 is a time chart for indicating an example of a power supply voltage dependent characteristic of a control voltage in the voltage control type control apparatus shown in FIG. 1. FIG. 2(1) represents a power supply voltage dependent characteristic in the case that the power supply voltage Vdd is 3.0 V, and FIG. 2(2) shows another power supply voltage dependent characteristic in the case that the power supply voltage Vdd is 2.7 V. An abscissa of this drawing indicates time, and an ordinate thereof shows a voltage.

FIG. 3 graphically shows an example of a control voltage characteristic of the gain control circuit 22 shown in FIG. 1. An abscissa of this drawing denotes a control voltage (V) and an ordinate thereof represents a gain (dB).

Considering now that when the power supply voltage of the digital circuit 10 is selected to be 3.0 V, the PDM signal is outputted in a half of density, a voltage signal waveform appearing at the output terminal T2 from which the PDM signal of the digital circuit 10 is indicated in a right half side of FIG. 2(1).

In other words, a Hi-(high) level of a voltage signal appearing at the output terminal T2 is 3.0 V equal to the power supply voltage Vdd.

On the other hand, a voltage signal waveform appearing at the input terminal T4 into which the PDM signal of the analog circuit 20 is entered is indicated a left half side of FIG. 2(1) after this PDM signal has passed through the LPF 30.

Then, this analog voltage value of 1.5V is applied as the control voltage to the analog circuit 20.

For the sake of an easy understanding, it is assumed that the control voltage generating circuit 21 directly outputs the input voltage as the control voltage. It is also assumed that the control characteristic of the gain control circuit 22 corresponds to a straight line of 40 dB/V, which will pass through 0 dB at 1.5 V, as indicated by a wide line in FIG. 3.

In this case, the gain of the gain control circuit 22 becomes 0 dB upon receipt of the control voltage of 1.5 V. The main signal at the input terminal T5 supplied to the gain control circuit 22 of the analog circuit 20, namely the input signal derived from the terminal T5, has the gain of 0 dB.

As a consequence, the input signal derived from the terminal T5 is directly outputted from the output terminal T6 of the main signal derived from the gain control circuit 22 of the analog circuit 20.

On the other hand, assuming now such a case that, for example, energy of a cell used as the power supply is depleted, the power supply voltage Vdd is lowered to 2.7 V, a voltage signal waveform appearing at the PDM signal output terminal T2 of the digital circuit 10 is indicated in a right half side of FIG. 2(2).

That is, a Hi-level of the voltage signal appearing at the output terminal T2 s equal to the power supply voltage Vdd, namely 2.7V.

As a consequence, a voltage signal waveform appearing at the PDM signal input terminal T4 of the analog circuit 20, which has passed through the LPF 30, is indicated in a left half side of FIG. 2(2).

Accordingly, the analog voltage value of 1.35 V is applied as the control voltage to the analog circuit 20.

At this time, it can be recognized from the control characteristic of FIG. 3 that the gain of the gain control circuit 22 is set to −6 dB.

As previously described, when the gain of the gain control circuit 22 is changed from 0 dB to −6 dB, this control error would become the very large value in the case of such an apparatus requiring the current control. Thus, there is a problem that this control error would exceed the allowable range.

SECOND PRIOR ART

The previously explained voltage control type control apparatus shown in FIG. 1 owns the below-mentioned problem. That is, in such a case that, for example, the energy of the cell used as the power supply is depleted, the power supply voltage Vdd is lowered to 2.7 V, and thus, the gain of the gain control circuit 22 is changed from 0 dB to −6 dB. As a result, the control error is increased.

One solution method has been proposed so as to solve this problem. That is, the power supply voltage of the PDM signal output buffer circuit employed in the digital circuit is applied as the reference voltage to the analog circuit, and then this reference voltage is used to regulate the control voltage outputted from the LPF.

FIG. 4 shows an example of the voltage control type control apparatus for executing this solution method.

FIG. 4 is a functional block diagram for indicating the voltage control type control apparatus with employment of the PDM signal, as the second prior art. In this drawing, symbol "T11" is a second output terminal of the digital circuit 10, and symbol "T21" shows a second input terminal of the analog circuit 20. Other reference numbers shown in FIG. 4 represent the same, or similar circuits shown in FIG. 1.

In this voltage control type control apparatus, in order that the power supply voltage Vdd applied to the PDM signal output buffer circuit 13 of the digital circuit 10 is used as the reference voltage of the analog circuit 20, the second output terminal T11 is added on the side of the digital circuit 10 and also the second input terminal T21 is added on the side of the analog circuit 20, and further the second output terminal T11 is connected to the second input terminal T21.

Then, the digital circuit 10 outputs the power supply voltage Vdd of the PDM signal output buffer circuit 13 as a reference voltage of a wave peak of the PDM signal from the newly added second output terminal T11.

This reference voltage is applied via the second input terminal T21 to the control voltage producing circuit 21.

In the control voltage producing circuit 21, the control voltage inputted from the control voltage input terminal T4 is regulated by using the applied control voltage (namely, power supply voltage Vdd of the digital circuit 10), and then the regulated control voltage is applied to the gain control circuit 22.

In the gain control circuit 22, the gain is varied in response to this control signal, and the signal entered from the input terminal T5 is amplified, or attenuated, and then the amplified, or attenuated signal is outputted to the output terminal T6.

Next, the overall gain control characteristic of the analog circuit 20 employed in the voltage control type control apparatus shown in FIG. 4 will now be described more in detail with reference to FIG. 5.

FIG. 5 graphically shows an example of the control voltage characteristic with respect to the gain control circuit 22 shown in FIG. 4. An abscissa of FIG. 5 indicates a voltage ratio of the control voltage (V) to the reference voltage (V), and an ordinate denotes a gain (dB).

As indicated in FIG. 5, when the power supply voltage Vdd of the digital circuit 10 is varied in the gain control circuit shown in FIG. 4, in the case that such a signal is outputted whose voltage ratio is ½ of the PDM signal, the ½-regulated control voltage can be received on the side of the analog circuit 20. Thus, it is possible to continuously obtain the gain of 0 dB.

As a consequence, the correct control can be carried out.

However, the voltage control type control apparatus of the second prior art indicated in FIG. 4 merely realizes the relatively correct control, as compared with the above-described voltage control type control apparatus. Assuming now that the ON-resistance value of the P-MOS transistor employed in the PDM signal output buffer circuit 13 is sufficiently small, since a voltage drop may occur whose magnitude is defined only by this ON-resistance value, this may cause one factor of the control error.

Moreover, since the total number of interfaces of the voltage control type control apparatus shown in FIG. 4 is increased by one set, if this voltage control type control apparatus is used in an IC (integrated circuit) whose pin numbers are limited, then there is another problem that this voltage control type control apparatus can be hardly assembled into such an IC.

SUMMARY OF THE INVENTION

As a consequence, an object of the present invention is to provide a voltage control type control apparatus capable of achieving a correct control characteristic without increasing a total number of interfaces.

A control voltage producing apparatus, according to the present invention, is featured by comprising: pulse-modulated signal generating means into which a digital control signal used to generate a target control voltage is inputted, and from which a pulse-modulated signal having an amplitude defined based upon a voltage applied from a first voltage source is generated in response to the digital control signal; an averaged voltage producing circuit for averaging the pulse-modulated signal generated from the pulse-modulated signal generating circuit to thereby output an averaged voltage; an operation control voltage output circuit for outputting, or not outputting an operation control voltage of the first voltage source in response to a state of a control logic signal; a control voltage producing circuit for producing the target control voltage from the averaged voltage applied from the averaged voltage producing circuit and the operation control voltage outputted from the operation control voltage outputting circuit; and an operation control circuit for controlling a supply of a power supply voltage to the control voltage producing circuit in response to the value of the operation control voltage outputted from the operation control voltage output circuit.

Furthermore, in accordance with the present invention; the pulse-modulated signal generating means includes: a pulse-modulated signal generating circuit for generating a pulse-modulated signal having an arbitrary constant amplitude in response to the digital control signal; and a buffer circuit for converting the arbitrary constant amplitude of the pulse-modulated signal into an amplitude defined based on the voltage applied from the first voltage source. Also, the operation control voltage output circuit is such a buffer circuit having the same arrangement as that of the buffer circuit.

BRIEF DESCRIPTION OF THE DRAWINGS

For a better understanding of the present invention, reference is made of a detailed description to be read in conjunction of the accompanying drawings, in which.

DETAILED DESCRIPTION OF THE PREFERRED EMBODIMENTS

First Embodiment Mode

Figure 4:
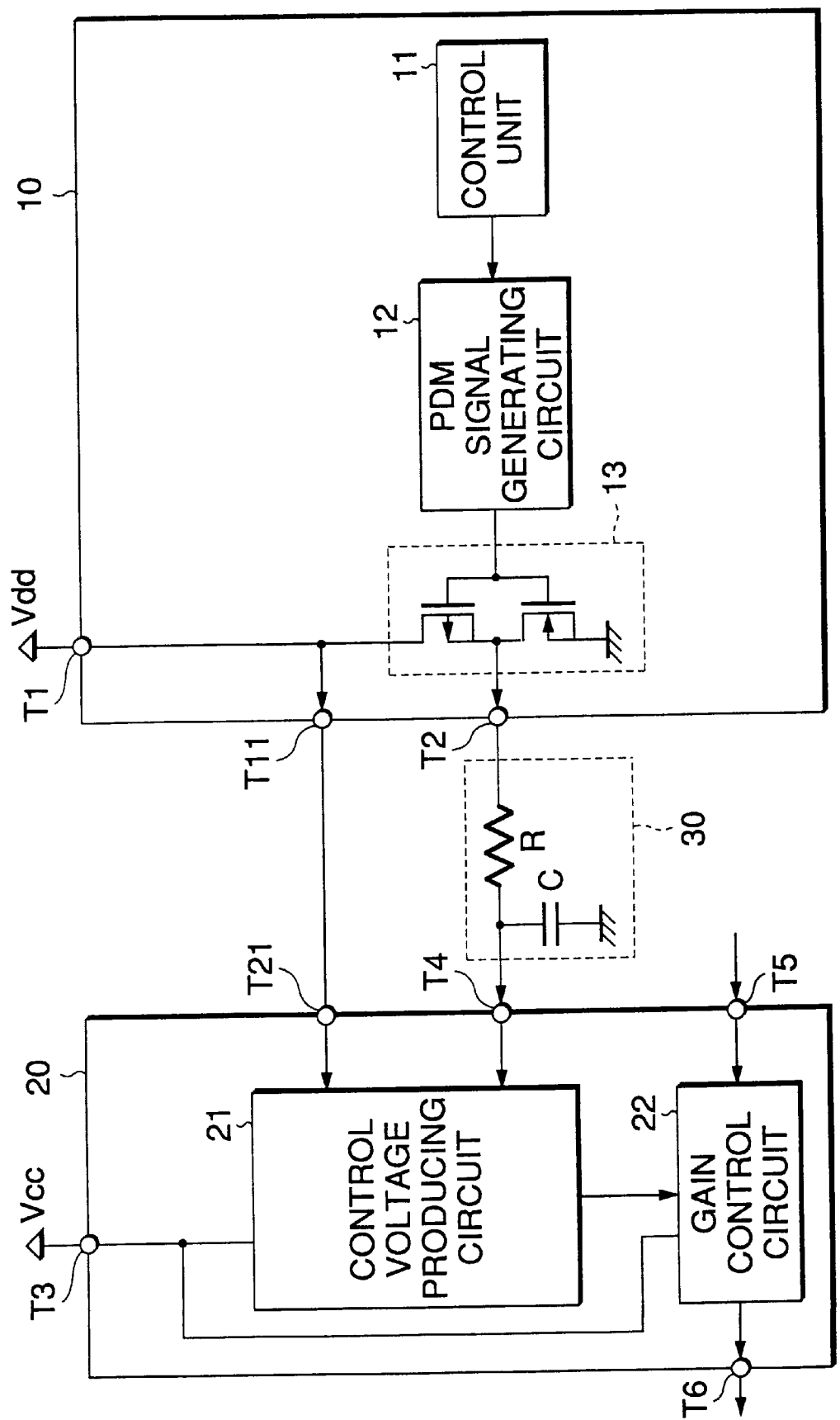
FIG. 4 is a functional block diagram for indicating the second arrangement example of the conventional voltage control type control apparatus with using the PDM signal.

In summary, a voltage control type control apparatus, according to a first embodiment mode of the present invention, is featured by improving the previously explained conventional voltage control type control apparatus shown in FIG. 4, so that a correct (precise) control characteristic can be achieved without increasing a total number of interfaces thereof.

Figure 6:
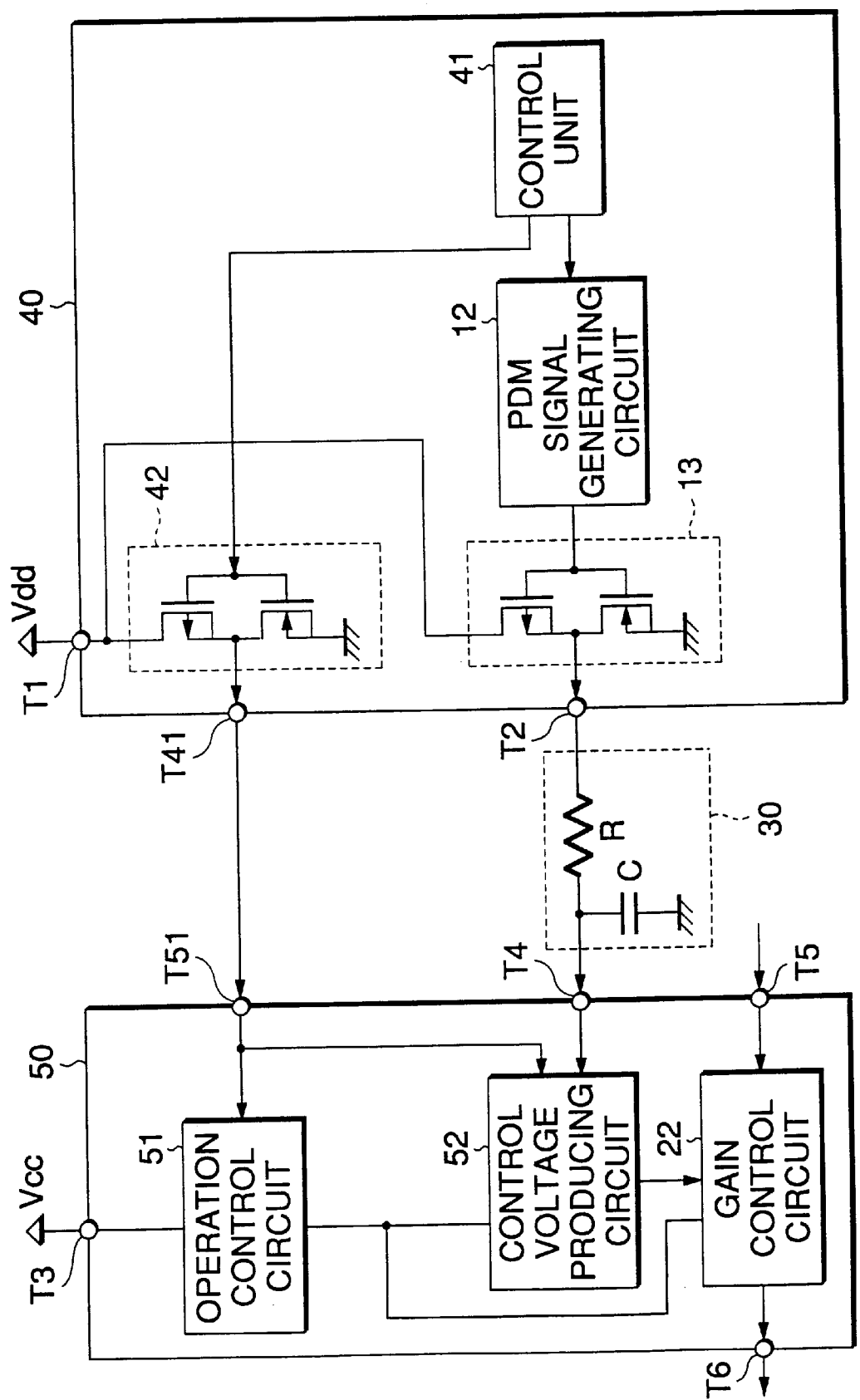
FIG. 6 is a functional block diagram for representing an example of a major arrangement of a voltage control type control apparatus according to a first embodiment mode of the present invention.

FIG. 6 is a functional block diagram for showing an example of a major circuit arrangement of the voltage control type control apparatus according to the first embodiment of the present invention. In this drawing, similar to reference numerals shown in FIG. 1, reference numeral 40 indicates a digital circuit; reference numeral 12 shows a PDM signal generating circuit; reference numeral 13 represents a PDM signal output buffer circuit; and reference numeral 41 denotes a control unit; reference numeral 42 denotes an output buffer circuit for an operation mode control signal; reference numeral 30 is an LPF (low-pass filter); reference numeral 50 represents an analog circuit; reference numeral 22 shows a gain control circuit; reference numeral 51 denotes an operation control circuit; and reference numeral 52 shows a control voltage producing circuit. Further, symbol "T41" indicates an operation mode control signal output terminal of the digital circuit 40; and symbol "T51" represents an operation mode control signal input terminal of the analog circuit 50. It should be understood that the output buffer circuit 13 owns the same circuit arrangement as that of the output buffer circuit 42.

Figure 1:
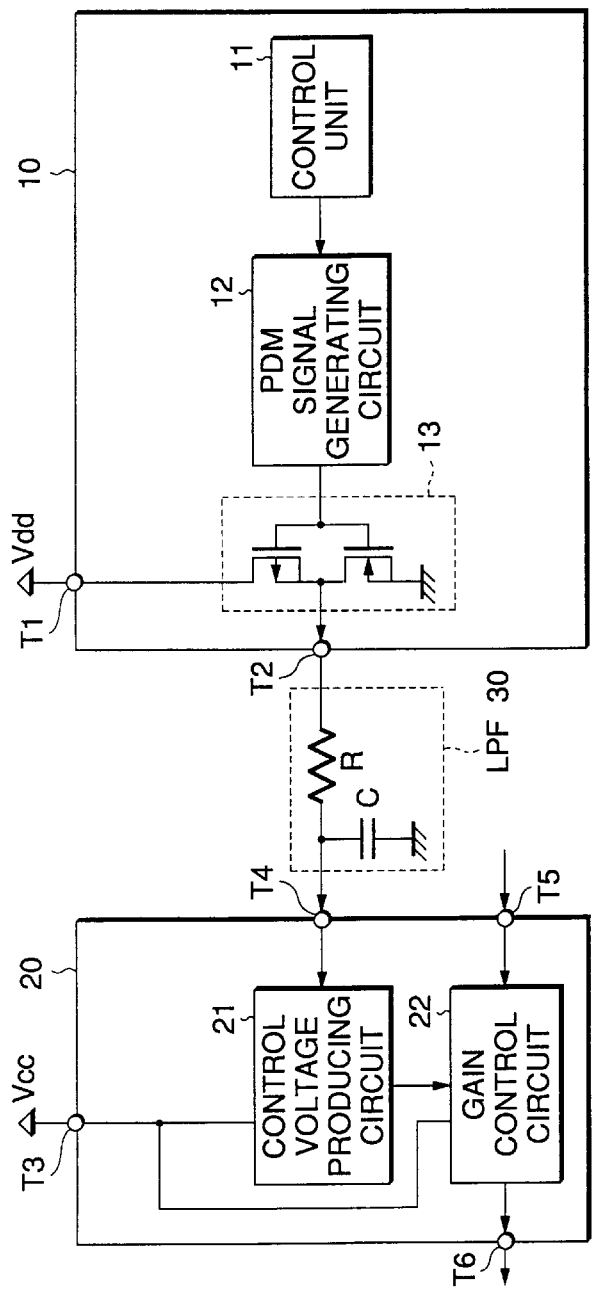
FIG. 1 is a functional block diagram for showing the first arrangement example of the conventional voltage control type control apparatus with using the PDM signal.
Figure 2:
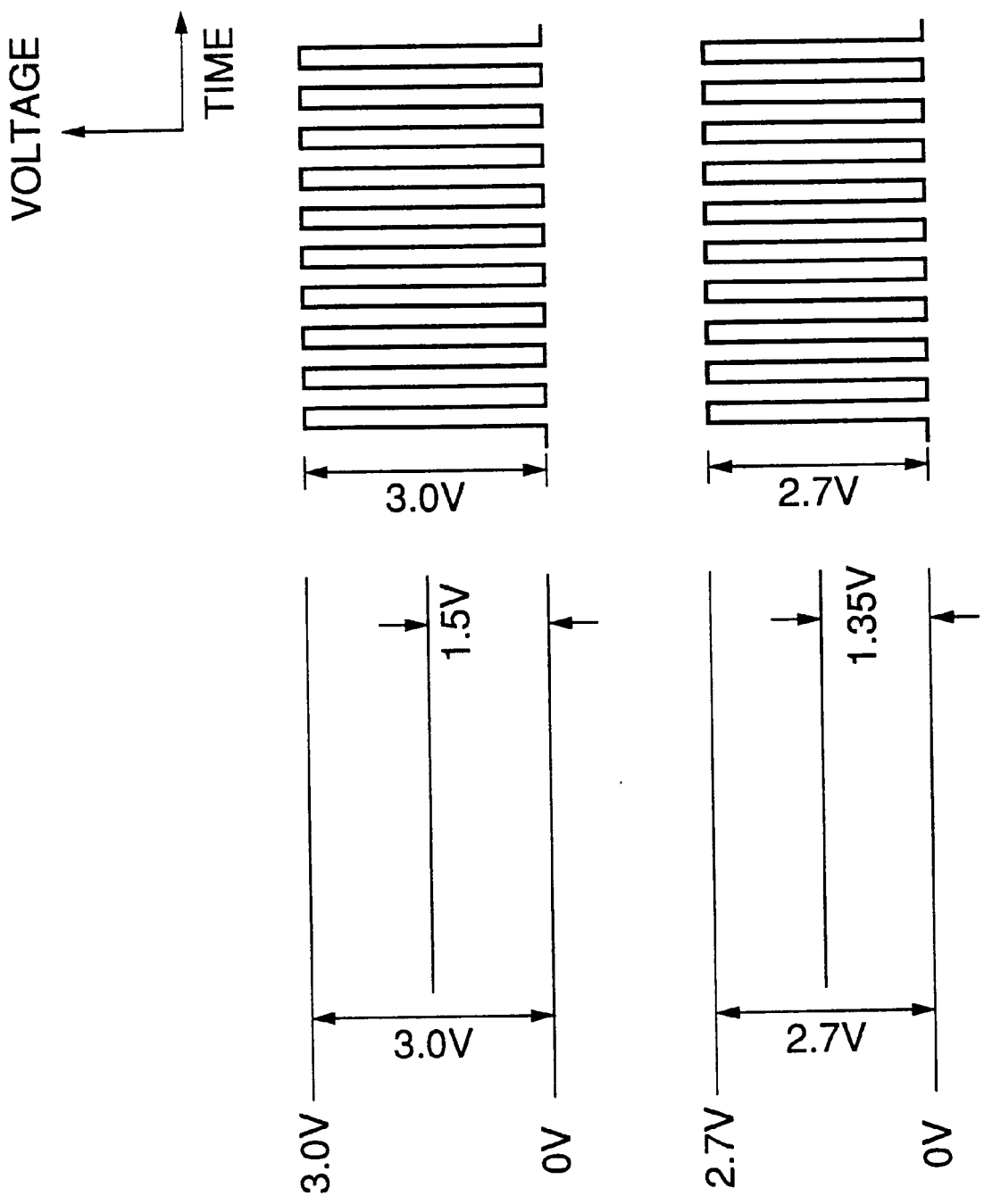
FIG. 2(1) and 2(2) are time charts for representing one example of the power supply voltage dependent characteristic of the control voltage as to the voltage control type control apparatus shown in FIG. 1.
Figure 3:
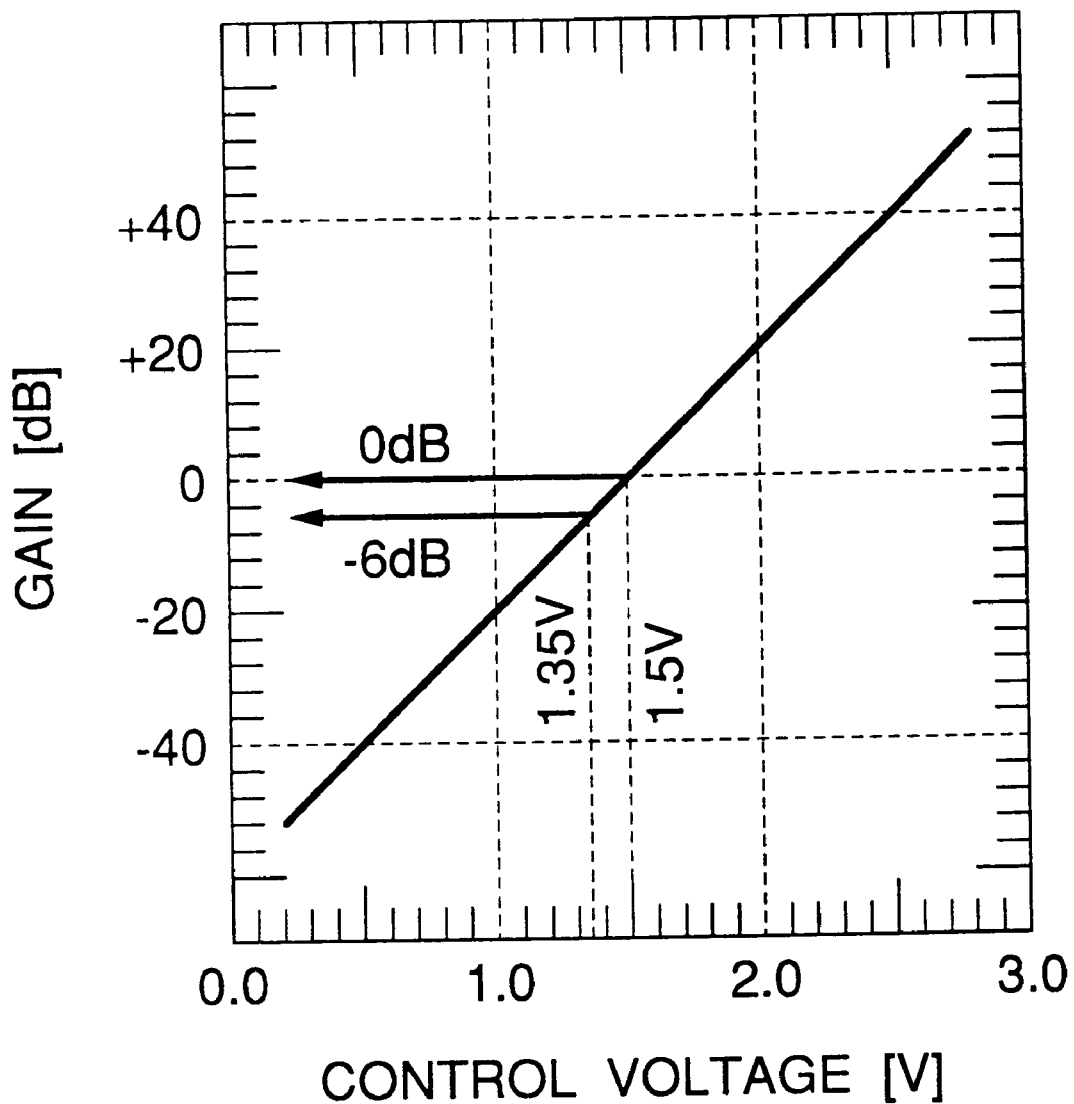
FIG. 3 graphically indicates one example of the control voltage characteristic as to the gain control circuit 22 indicated in FIG. 1.

The digital circuit 40 of this first voltage control type control apparatus indicated in FIG. 6 owns such a different point from the above-explained digital circuit 10 of FIG. 1 and FIG. 4, namely a function of the control unit 41 employed in this digital circuit 40.

The control unit 41 causes the analog circuit 50 to be turned ON/OFF, and also judges the operation of the analog circuit 50 in response to an information signal supplied from other circuits. When the analog circuit 50 is turned ON, a digital output signal having a high level is entered as a first operation mode control signal to the output buffer circuit 42. At this time, a voltage (Vdd−$V_{DS}$) is applied as a second operation mode control signal from the output buffer circuit 42 to the output terminal T41. This voltage is produced by subtracting a dropped voltage "$V_{DS}$" obtained from an ON-resistance value between a drain of a P-MOSFET and a source thereof from the power supply voltage Vdd. Also, when the analog circuit 50 is turned OFF, a digital output signal having a low level is entered as a first operation mode control signal from the control unit 41 to the output buffer circuit 42. At this time, the dropped voltage $V_{DS}$ produced by the ON-resistance value between the drain and the source of the P-MOSFET is applied as the second operation mode control signal to the output terminal T41.

The second operation mode control signal is entered from the output terminal T41 via the operation mode control input terminal T51 to the operation control circuit 52 employed in the analog circuit 50.

When the voltage of the second operation mode control signal is equal to (Vdd−$V_{DS}$), the operation control circuit 52 applies the power supply voltage Vcc to both the control voltage producing circuit 52 and the gain control circuit 22 so as to bring these circuits 52 and 22 into operation conditions. On the other hand, when the second operation mode control signal is equal to $V_{DS}$, the operation control circuit 52 does not apply the power supply voltage Vcc to the control voltage producing circuit 52 and the gain control circuit 22, so that these circuits 52 and 22 are set to non-operative conditions. As described above, when the first operation mode control signal becomes the high level, the analog circuit 50 is brought into the operation condition, whereas the first operation mode control signal becomes the low level, the analog circuit 50 is brought into the non-operative mode.

Also, this second operation mode control signal, namely the operation mode control signal inputted from the operation mode control signal input terminal T51 into the analog circuit 50 is also supplied to the control voltage producing circuit 52.

Similar to the circuit of the previously explained conventional voltage control type control apparatus indicated in FIG. 4, the control voltage producing circuit 52 uses the second operation mode control signal as the reference voltage of the PDM signal, and regulates the control voltage entered therein via the PDM signal input terminal T4 to thereby apply the regulated control voltage to the gain control circuit 22.

In response to this control signal, the gain control circuit 22 changes the gain, and amplifies, or attenuates the signal inputted from the input terminal T5 to supply the amplified, or attenuated signal to the output terminal T6.

Figure 5:
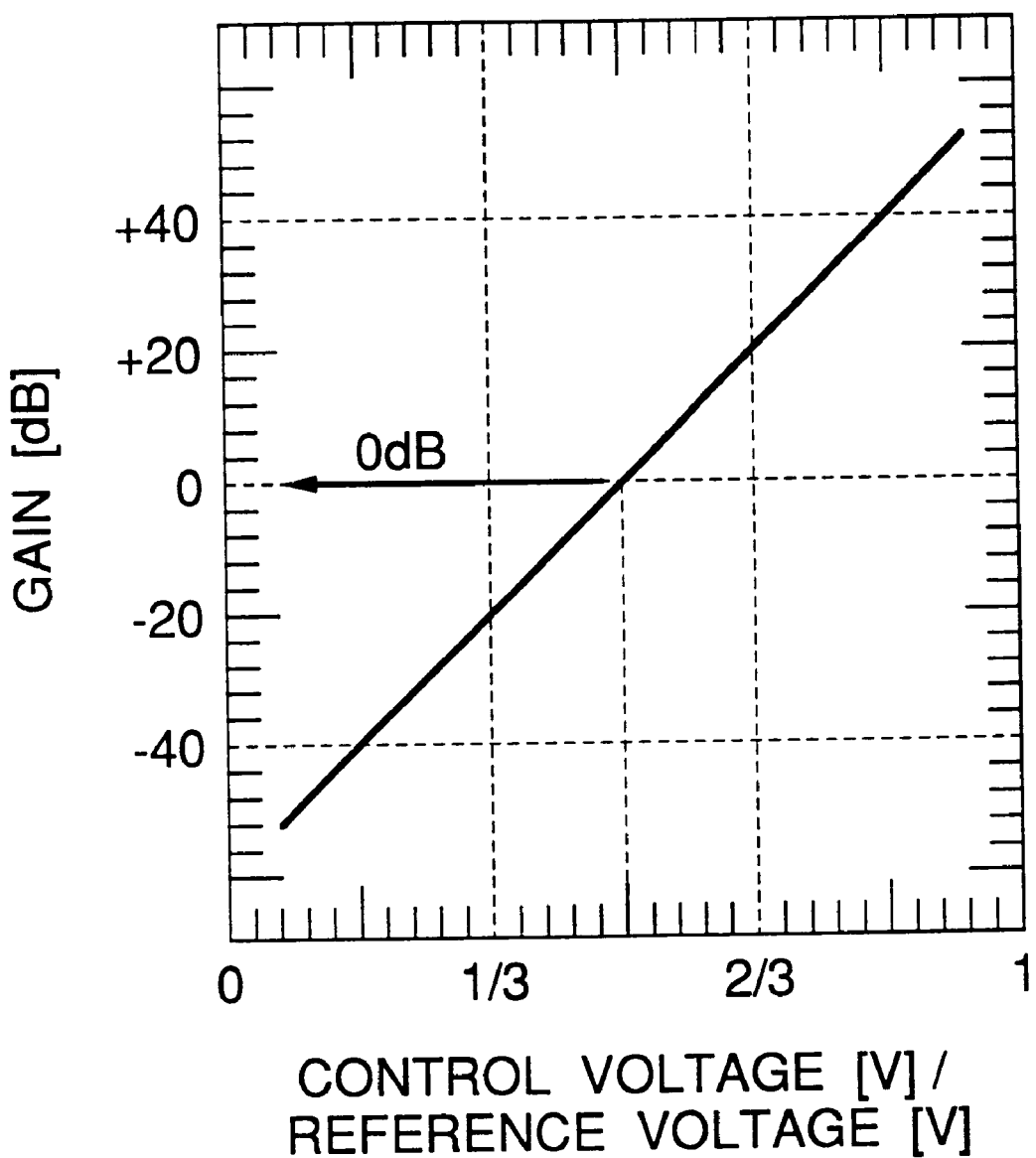
FIG. 5 graphically indicates one example of the control voltage characteristic as to the gain control circuit 22 indicated in FIG. 4.

As a result, the control characteristic can be obtained which has been explained in the second prior art with reference to FIG. 5, so that the control error caused by the variation in the power supply voltage Vdd of the digital circuit can be lowered.

Now, a more concrete description will be made of the control voltage producing circuit 51 shown in FIG. 6.

Figure 7:
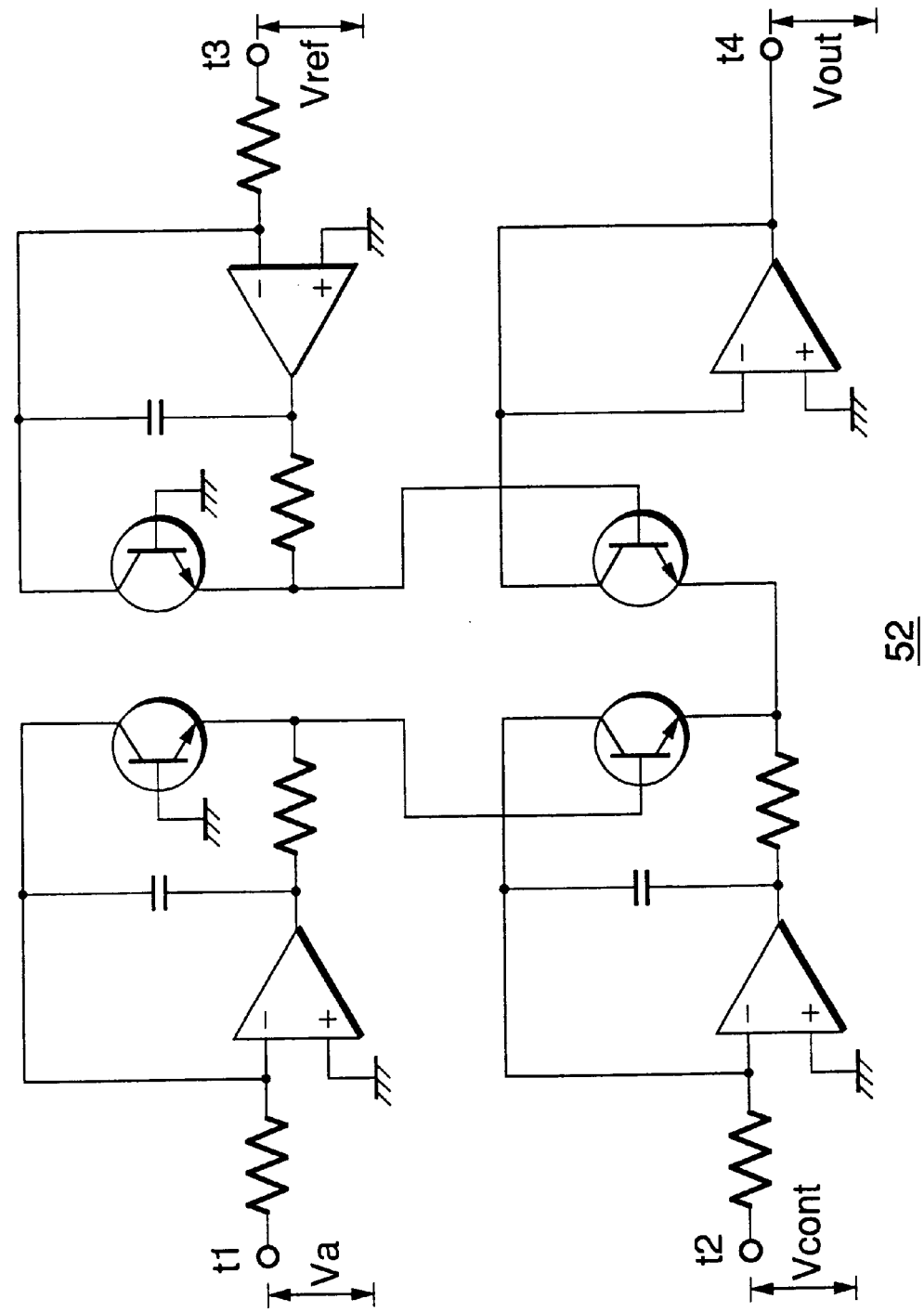
FIG. 7 is a circuit diagram for showing an example of a detailed circuit arrangement of a control voltage producing circuit 51 employed in the voltage control type control apparatus of FIG. 6.

FIG. 7 is a circuit diagram for representing an example of a detailed circuit arrangement as to the control voltage producing circuit 51. In this drawing, symbol "t1" is a constant voltage input terminal; symbol "t2" shows a control voltage input terminal; symbol "t3" denotes a reference voltage input terminal; symbol "t4" represents a regulated voltage output terminal; symbol "Va" shows a voltage applied to the constant voltage input terminal t1 and used to determine a gain coefficient; symbol "Vcont" is a voltage applied to the control voltage input terminal t2; symbol "Vref" represents a voltage applied to the reference voltage input terminal t3; and symbol "Vout" indicates an output voltage appearing at the regulated voltage output terminal t4.

The control voltage producing circuit 51 shown in FIG. 7 corresponds to one example of a voltage regulating circuit which employs a multiplying/dividing circuit for combining a logarithm amplifier with an inverse logarithm amplifier, which are generally used.

In FIG. 7, the voltage Va applied to the constant voltage input terminal t1 and used to determine the gain coefficient is equal to such a voltage applied from the operation control circuit 51 of the analog circuit 50 indicated in FIG. 6 to the control voltage producing circuit 52.

Also, the voltage Vcont applied to the control voltage input terminal t2 corresponds to a voltage applied to the PDM signal input terminal T4 of the analog circuit 50 shown in FIG. 6.

The voltage Vref applied to the reference voltage input terminal t3 is equal to a voltage applied to the operation mode control signal input terminal T51 of the analog circuit 50 shown in FIG. 6.

The output voltage Vout of the regulated voltage output terminal t4 corresponds to a control voltage applied from the control voltage producing circuit 52 shown in FIG. 6 to the gain control circuit 22.

In this control voltage producing circuit 52 shown in FIG. 7, namely the voltage regulating circuit, the output voltage Vout of the regulated voltage output terminal t4, namely the regulated voltage may be expressed by the following formula (1).

$$Vout = Va \times Vcont / Vref \qquad (1).$$

As apparent from this formula (1), it can be understood that the regulated voltage Vout is regulated based on the voltage applied to the reference voltage input terminal t3, namely the reference voltage Vref.

When the control unit 41 contained in the digital circuit 40 judges that the analog circuit 50 need not be operated, the first operation mode control signal becomes a low level.

Upon receipt of this signal having the low level, the operation control circuit 52 employed in the analog circuit 50 opens the power supply lines connected from the power supply voltage Vcc to the respective circuit portions in order to bring the analog circuit 50 into the non-operative condition in this first embodiment mode.

In this case, the reference voltage used to produce the control voltage and entered into the control voltage producing circuit 52 would become the voltage $V_{DS}$ substantially equal to 0 V. However, since this circuit portion is under non-operative condition at this time, the operation of this circuit portion is not directly influenced even when the control voltage has any value.

This operation mode control may constitute the necessary function where a strong demand is made of lowering the low power consumption. This operation mode control is a basically necessary interface.

As previously described, in accordance with the voltage control type control apparatus of the first embodiment mode, since the signal lines thereof and the signal line for the reference voltage having the PDM amplitude are made unity, the voltage control with employment of the correct PDM signal can be realized without increasing the total number of the interfaces.

Also, different from the previously explained first prior art circuit, the operation mode control signal which is commonly used with the reference voltage constitutes a digital CMOS output.

As a consequence, even when the ON-resistance value of the P-MOSFET is not sufficiently low, if the ON-resistance value characteristics of the P-MOSFETs of the two output buffer circuits, namely the output buffer circuit 44 for the operation mode control signal, and the output buffer circuit 13 for the PDM signal are matched to each other, then there is no control error.

As explained above, in the voltage control type control apparatus according to the first embodiment mode, in particular, when the digital circuit 40 is combined with each other, two sets of output buffer circuits are arranged close to each other. As a consequence, since the ON-resistance values of the P-MOSFETs whose characteristics are very closely matched with each other, this voltage control type control apparatus is very useful for precise controls.

Second Embodiment Mode

Comparing with the above-described voltage control type control apparatus according to the first embodiment mode, a voltage control type control apparatus according to a second embodiment mode of the present invention is featured by that resistors having resistance values matched with each other are arranged in various circuit portions so as to compensate for dropped voltages caused by these resistors, so that control precision can be further improved.

Figure 8:
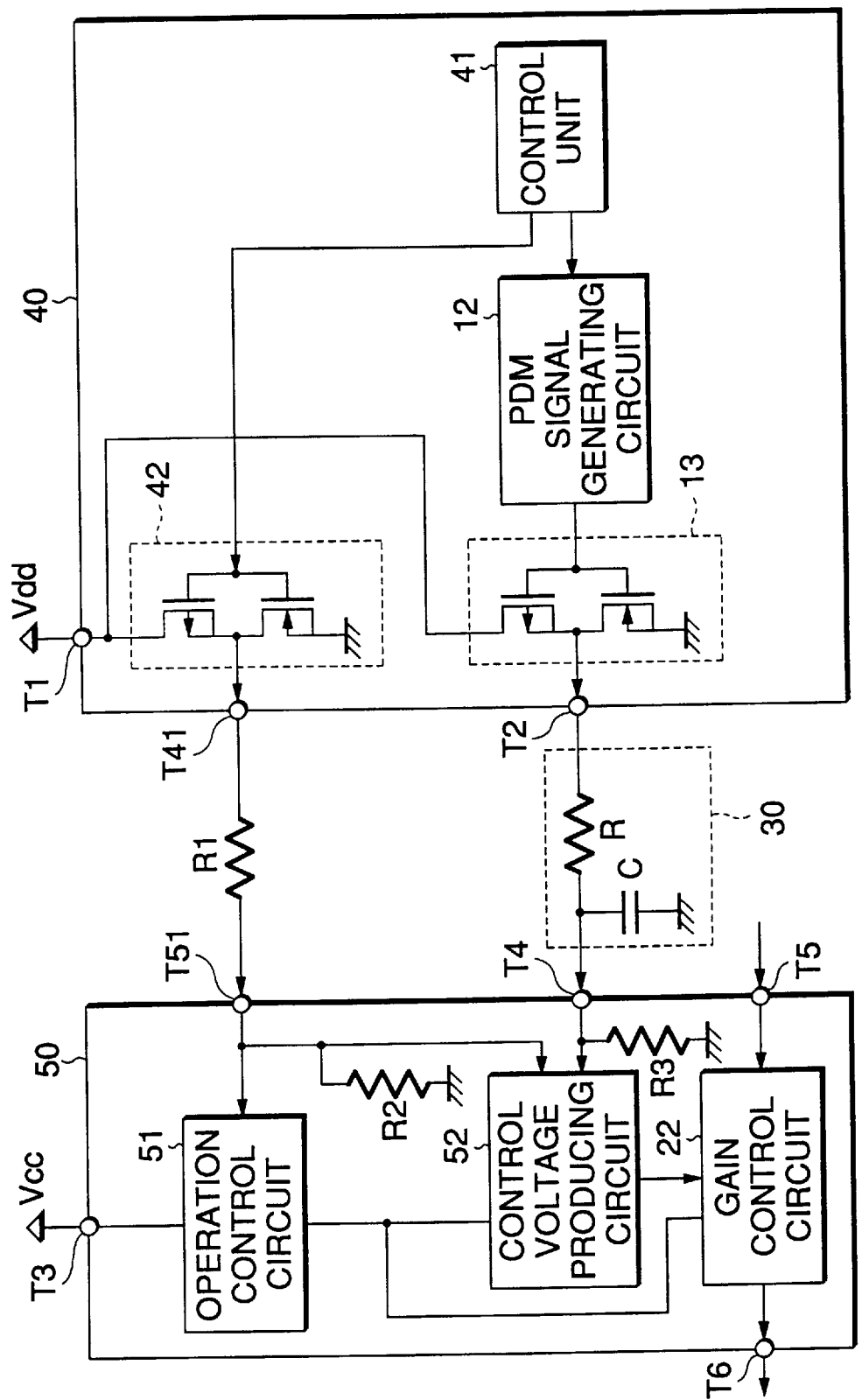
FIG. 8 is a functional block diagram for representing an example of a major arrangement of a voltage control type control apparatus according to a second embodiment mode of the present invention.

FIG. 8 is a functional block diagram for showing an example of a major circuit arrangement of a voltage control type control apparatus according to the second embodiment mode of the present invention. In this drawing, symbol "R1" shows a second resistor; symbol "R2" denotes a third resistor; symbol "R3" represents a fourth resistor; and other reference numerals are similar to those of FIG. 6.

In the voltage control type control apparatus shown in FIG. 8, the second resistor R1 (whose resistance value is assumed as "r1") is connected between the operation mode control signal output terminal T41 from the digital circuitg 40 and the operation mode control signal input terminal T51 of the analog circuit 50. This second resistor R1 owns the same resistance value (this resistance value is assumed as "r0") of the resistor R used in the LPF 30.

Also, on the side of the analog circuit 50, the third resistor R2 (whose resistance value is assumed as "r2") having the same resistance value as the resistor R of the LPF 30 is interposed between the operation mode control signal input terminal T51 and the control voltage producing circuit 52.

Furthermore, the fourth resistor R3 (whose resistance value is assumed as "r3") having the same resistance value as the resistor R of the LPF 30 is interposed between the PDM signal input terminal T4 and the input side of the operation control circuit 52.

It should be understood that the input resistance values of the operation control circuit 52 and the control voltage producing circuit 51 are very high, as compared with the resistance values of these second resistor R1, third resistor R2, and fourth resistor R3, and therefore the adverse influences thereof are negligible.

With employment of the above-described arrangement, the control voltage is subdivided by the resistor R (whose resistance value is "r0") employed in the LPF 30 and the fourth resistor R3 (whose resistance value is "r3"), so that the voltage is dropped only by the ratio of the resistance values, i.e., r0/(r0+r3).

However, since the reference voltage is subdivided by the second resistor R1 (whose resistance value is "r1") and the third resistor R2 (whose resistance value is "r2"), which own the same resistance values, the voltage drop values are eventually equal to each other.

As a consequence, the control voltage producing circuit 51 regulates the voltage by such a control voltage, this voltage drop gives no adverse influence to the control.

This second embodiment mode is very useful in such an arrangement that the analog circuit 50 is assembled within one IC, since the third resistor R2 is positioned very close to the fourth resistor R3, so that it is possible to obtain the resistance values whose characteristics are very fitted to each other.

For an easy understanding of the present invention, the above-described prior art and various embodiment modes have described the characteristics of the circuits controlled by the voltages with respect to the gain. However, the voltage control type control apparatus according to the present invention is not apparently limited to the above-explained embodiment modes.

For example, the present invention may be similarly applied to circuits capable of controlling circuit characteristics based on voltages, for instance, an oscillator capable of adjusting a frequency under control of a voltage, and further all of control apparatuses.

In accordance with the voltage control type control apparatus according to the present invention, the PDM signal is used, and thus the correct control characteristic can be obtained without increasing the total number of interfaces.

Also, in accordance with the voltage control type control apparatus according to the present invention, the correct voltage control can be realized while executing the very precise operation-on/off controls in order to reduce the power consumption in addition to the effect achieved by the voltage control type control apparatus as claimed in claim 1.

What is claimed is:

1. A control voltage producing apparatus comprising:

pulse-modulated signal generating means for generating a pulse-modulated signal having an amplitude defined according to a first power supply voltage supplied by a first voltage source in response to a digital control signal;

an averaged voltage producing circuit for averaging said pulse-modulated signal generated by said pulse-modulated signal generating circuit to thereby output an averaged voltage;

an operation control voltage output circuit for selectively outputting an operation control voltage based on said power supply voltage of said first voltage source in response to a state of a control logic signal;

a control voltage producing circuit for producing a target control voltage using said averaged voltage output from said averaged voltage producing circuit and said operation control voltage output from said operation control voltage output circuit; and an operation control circuit for controlling a supply of a second power supply voltage to said control voltage producing circuit in response to a value of said operation control voltage output from said operation control voltage output circuit.

2. A control voltage producing apparatus as claimed in claim 1 wherein said pulse-modulated signal generating means includes:

a pulse-modulated signal generating circuit having a predetermined constant amplitude in response to said digital control signal; and a buffer circuit for converting said predetermined constant amplitude of the pulse-modulated signal into an amplitude defined according to the first power supply voltage supplied by said first voltage source.

3. A control voltage producing apparatus as claimed in claim 2 wherein:

said operation control voltage output circuit includes a second buffer circuit having the same arrangement as that of said buffer circuit.

4. A control voltage producing apparatus as claimed in claim 2 wherein:

said pulse-modulated signal generating circuit includes a pulse duration modulating circuit for generating a pulse duration modulated signal.

5. A control voltage producing apparatus as claimed in claim 2 wherein:

said pulse-modulated signal generating circuit includes a pulse width modulating circuit for generating a pulse width modulated signal.

6. A control voltage producing apparatus as claimed in claim 3 wherein:

said buffer circuit includes two FETs (field-effect transistors), gates of said two FETs being mutually connected to each other to thereby constitute an output terminal, and two remaining terminals of said two FETs being connected to said first voltage source and a reference potential sources, respectively.

7. A control voltage producing apparatus as claimed in claim 1 wherein:

said averaged voltage producing circuit includes a low-pass filter having a resistor and a capacitor.

8. A control voltage producing apparatus as claimed in claim 7 wherein:

an input terminal of said control voltage producing circuit and an input terminal of said operation control circuit are terminated by respective first and second termination resistors having the same resistance value, and a third resistor in said low-pass filter is interposed between said operation control voltage producing circuit and said control circuit.

* * * * *